(12) United States Patent
Harron et al.

(10) Patent No.: US 6,982,607 B2
(45) Date of Patent: *Jan. 3, 2006

(54) AMPLITUDE AND PHASE MODULATION USING DUAL DIGITAL DELAY VECTORS

(75) Inventors: Gerald Harron, Martensville (CA);
Jason T. Tucker, Saskatoon (CA);
Surinder Kumar, Victoria (CA)

(73) Assignee: VCom Inc., Victoria (CA)

( * ) Notice: Subject to any disclaimer, the term of this patent is extended or adjusted under 35 U.S.C. 154(b) by 64 days.

This patent is subject to a terminal disclaimer.

(21) Appl. No.: 10/796,419

(22) Filed: Mar. 10, 2004

(65) Prior Publication Data
US 2005/0116786 A1    Jun. 2, 2005

Related U.S. Application Data

(60) Provisional application No. 60/525,117, filed on Nov. 28, 2003.

(51) Int. Cl.
*H03K 7/10* (2006.01)
(52) U.S. Cl. ....................... 332/108; 332/103; 375/298
(58) Field of Classification Search ................ 332/103, 332/104, 108; 375/298
See application file for complete search history.

(56) References Cited

U.S. PATENT DOCUMENTS

| | | |
|---|---|---|
| 5,329,259 A | 7/1994 | Stengel et al. |
| 5,612,651 A | 3/1997 | Chethik |
| 5,659,272 A | 8/1997 | Linguet |
| 5,852,389 A | 12/1998 | Kumar et al. |
| 5,867,071 A | 2/1999 | Chethik |
| 6,147,553 A | 11/2000 | Kolanek |
| 6,160,856 A | 12/2000 | Gershon |
| 6,313,703 B1 | 11/2001 | Wright et al. |
| 6,366,177 B1 | 4/2002 | McCune et al. |
| 2002/0051091 A1 * | 5/2002 | Dedieu et al. .............. 348/723 |
| 2002/0067218 A1 * | 6/2002 | Schenk ....................... 332/103 |

* cited by examiner

*Primary Examiner*—Joseph Chang
(74) *Attorney, Agent, or Firm*—Adrian D. Battison; Michael R. Williams; Ryan W. Dupuis

(57) ABSTRACT

The present invention provides a means to implement amplitude and phase modulation digitally and directly at an RF frequency that benefits from high output power using nonlinear amplifiers. This is accomplished by the combination of two constant amplitude phase varying vectors. A reference oscillator produces a carrier signal, which is supplied to two digital delay lines composed of a sequence of delay banks. The delay lines are controlled by lookup tables that are updated by the vector control circuit used to determine the delay of each digital delay line. The delay of the lines are set in such a way as to produce two vectors with the desired phase shift that, when summed together, produce a vector with the desired phase and amplitude characteristics.

19 Claims, 4 Drawing Sheets

AMPLITUDE AND PHASE MODULATION USING DUAL DIGITAL DELAY VECTORS

This application claims priority under 35 U.S.C. 119 from Provisional Application Ser. No. 60/525,117 filed Nov. 28$^{th}$, 2003.

This application is related to an application filed simultaneously with this application by the same inventors and entitled "Modulation using discrete amplitude adjustment and dual digital delay lines", the disclosure of which is incorporated herein by reference.

FIELD OF THE INVENTION

This invention relates generally to telecommunication systems. The present invention relates specifically to data transmission using analog signals, more specifically, to a unique method for providing amplitude and phase modulation of a signal using dual digital delay lines.

BACKGROUND OF THE INVENTION

The following references may be relevant to the present invention:
U.S. Pat. No. 5,329,259—Stengel, "Efficient Amplitude/Phase Modulation Amplifier"
U.S. Pat. No. 5,612,651—Chethik, "Modulating Array QAM Transmitter"
U.S. Pat. No. 5,659,272—Linguet, "Amplitude Modulation Method and Apparatus using Two Phase Modulated Signals"
U.S. Pat. No. 5,852,389—Kumar, "Direct QAM Modulator"
U.S. Pat. No. 5,867,071—Chethik, "High Power Transmitter Employing a high Power QAM Modulator"
U.S. Pat. No. 6,147,553—Kolanek, "Amplification Using Amplitude Reconstruction of Amplitude and/or Angle Modulated Carrier"
U.S. Pat. No. 6,160,856—Gershon, "System For Providing Amplitude and Phase Modulation of Line Signals Using Delay Lines"
U.S. Pat. No. 6,313,703—Wright et al., "Use of Antiphase Signals For Predistortion Training Within An Amplifier System"
U.S. Pat. No. 6,366,177—McCune, "High-Efficiency Power Modulators"

With the ever increasing demand for the high speed transfer of information digital systems are becoming very common. In its simplest form the modern telecommunication system requires circuits for modulation, frequency conversion, transmission and detection.

The basis for signal transmission is a continuous time varying constant-frequency signal known as a carrier. The carrier signal can be represented as $S(t)=A \cos(2\pi ft+\sigma)$, where f is the frequency, A is the amplitude, and $\sigma$ is the phase of the signal. S(t) is a deterministic signal, and alone carries no useful information. However, information could be encoded on S(t) if one or more of the following characteristics of the carrier were altered: amplitude, frequency or phase. In essence modulation is the process of encoding an information source onto a high-frequency, carrier signal S(t).

Bandpass digital systems can be divided into two main categories; binary digital systems or multilevel digital systems. Binary digital systems are limited in that they can only represent a one bit symbol (0 or 1) at any given time. The most common binary bandpass signal techniques are Amplitude Shift Keying (ASK), Phase Shift Keying (PSK), and Frequency Shift Keying (FSK). For example, a binary digital system using ASK might have a signal range from 0 to 3 Volts. Any value less than 1.5 Volts would represent a digital 0 and anything greater than 1.5 Volts would represent a digital 1. Alternatively, FSK would use two different frequencies and PSK would use two different phases to represent a digital 0 or 1. However, binary digital systems are not as practical as multilevel systems since digital transmission is notoriously wasteful of RF bandwidth, and regulatory authorities usually require a minimum bandwidth efficiency.

With multilevel digital systems, inputs with more than two modulation levels are used. In cases like this multiple bits can be sent with each symbol, increasing the speed and efficiency. In keeping with the previous example of an amplitude modulated signal with a range from 0 to 3 Volts, the signal amplitude could be broken into 4 distinct points; 0.75V could correspond to binary 00, 1.5V corresponds to 01, 2.25V corresponds to 10, and 3V corresponds to binary 11. In this case each symbol represents a two bit binary number. Alternatively, such transformations can be implemented by adjusting the phase or frequency of the carrier.

More advanced techniques for a multilevel digital system would include a combination of amplitude and phase modulation of a carrier signal. In this case a single multi-bit symbol could be represented by a signal with a certain phase and amplitude. Each symbol of digital data could be defined as a vector with a specified amplitude and angle and visualized on a polar axis. In one of its simplest forms a three bit digital symbol could be represented by two distinct amplitudes and four distinct phases.

There are various common modulation techniques which require the amplitude and phase adjustment of a carrier signal. Solutions to these modulation techniques are typically built in either analog or digital circuitry. One such solution which is shown and described hereinafter will be recognized by those skilled in the art as a IQ modulator. Due to its requirements for digital to analog conversion and linear power amplification before transmission, modulators of this form typically consume lots of power.

SUMMARY OF THE INVENTION

It is one object of the present invention to provide an apparatus for amplitude and phase modulation of a signal.

According to the invention there is provided an apparatus for amplitude and phase modulation of a signal comprising:

a reference pulse oscillator arranged to provide a signal in the form of a series of input pulses;

an input for input modulating data including desired amplitude and phase modulation;

a vector logic circuit responsive to the input modulating data;

two digital delay lines each coupled to said reference oscillator and each having multiple delay cells for selectively delaying respective pulses of said signal;

two lookup tables each of which contains information for controlling the delay cells of a respective one of the delay lines so as to control an overall delay of the respective one of the digital delay lines so as to generate therefrom a component vector which is dependent upon the input modulating data;

and a summer that is coupled to the two digital delay lines and arranged to combine together the component vectors from both of the delay lines to provide an output vector.

Preferably said vector logic circuit utilizes the desired amplitude and phase modulation to determine the phase of the two fixed magnitude component vectors.

Preferably said component vectors are assumed to have the same magnitude and be equidistant, radially, from the resultant vector.

Preferably the formula $\pm \cos^{-1}[r/(2V)]$ governs the phase offset of the component vectors from the desired output phase, where, in the governing formula, r represents the desired output magnitude and V is the magnitude of the component vectors.

Preferably said vector logic circuit compensates for the special cases where the phase of the leading or trailing vectors cross the 360° barrier, where compensation is accomplished by either adding or subtracting $2\pi$ from the absolute phase of the vector.

Preferably said vector logic circuit converts the phase information into an equivalent delay.

Preferably said vector logic circuit updates lookup tables with the information required to reproduce the required delay.

Preferably said delay lines contain a finite number of sequential or parallel delay cells capable of covering 360° of phase.

Preferably said delay cells have equivalent or weighted delay periods.

Preferably said delay lines contain a finite number of additional delay cells for the purpose of compensation in the range of the finest resolution step.

Preferably said delay cells contain a feedback edge detector whereupon detection of a falling edge enables the delay cell to confirm its next status from a lookup table.

Preferably said lookup tables contain the information required to reproduce a specified delay.

Preferably said tables are directly referenced by the digital delay lines in order to control which delay cells are enabled at a given time.

Preferably said tables contain redundant registers which contain both delay and compensation information.

Preferably said summer is coupled to the two digital delay lines for the purpose of combining two constant amplitude component vectors into a resultant vector containing a desired amplitude and phase.

Preferably said reference pulses are a high power pulse train.

The invention may provide one or more of the following advantages:

Digital data is converted into an analog signal without the use of digital to analog converters.

Digital data is converted into an analog signal which requires minimal amplification before transmission.

Digital data is converted into an analog signal which uses non-linear amplifiers.

It removes all digital to analog converters (DACs) from the modulation process.

It also provides a novel method for amplitude and phase modulation which does not require linear amplification.

Removal of the DACs and linear amplifier, results in a significant power reduction compared to conventional techniques.

The previously stated advantages are achieved, in part, by providing an amplitude and phase modulated system that produces two high power constant amplitude phase modulated vectors that, when summed together, will produce the desired amplitude and phase-modulated signal. In order to facilitate this action, an input reference pulse is fed into two digital delay lines (DDL) containing a specified number (N) of delay blocks. Unlike typical IQ modulator techniques, the reference signal, that is fed to the DDLs, does not have to be scaled back to maintain linearity. Each delay line is controlled by a lookup table, which contains the required delay to shift the input reference pulse to the desired phase. The phases of the two vectors are chosen by the vector logic block. The vector logic block updates the lookup tables for each delay line, thus establishing the phase of each vector. The phases of the vectors are chosen in such a way that when summed together they produce a resulting vector that contains both the desired phase and amplitude modulation.

Although the invention has general application in the field of signal modulation, the most direct use of the method described in the invention is the realization of a transmitter that converts digital data into an amplitude and phase modulated signal to be transmitted over a communications line. In this case, the vector produced by the invention represents a binary symbol. The number of bits in the symbol are determined by the encoding technique implemented.

DETAILED DESCRIPTION

Figure 1:
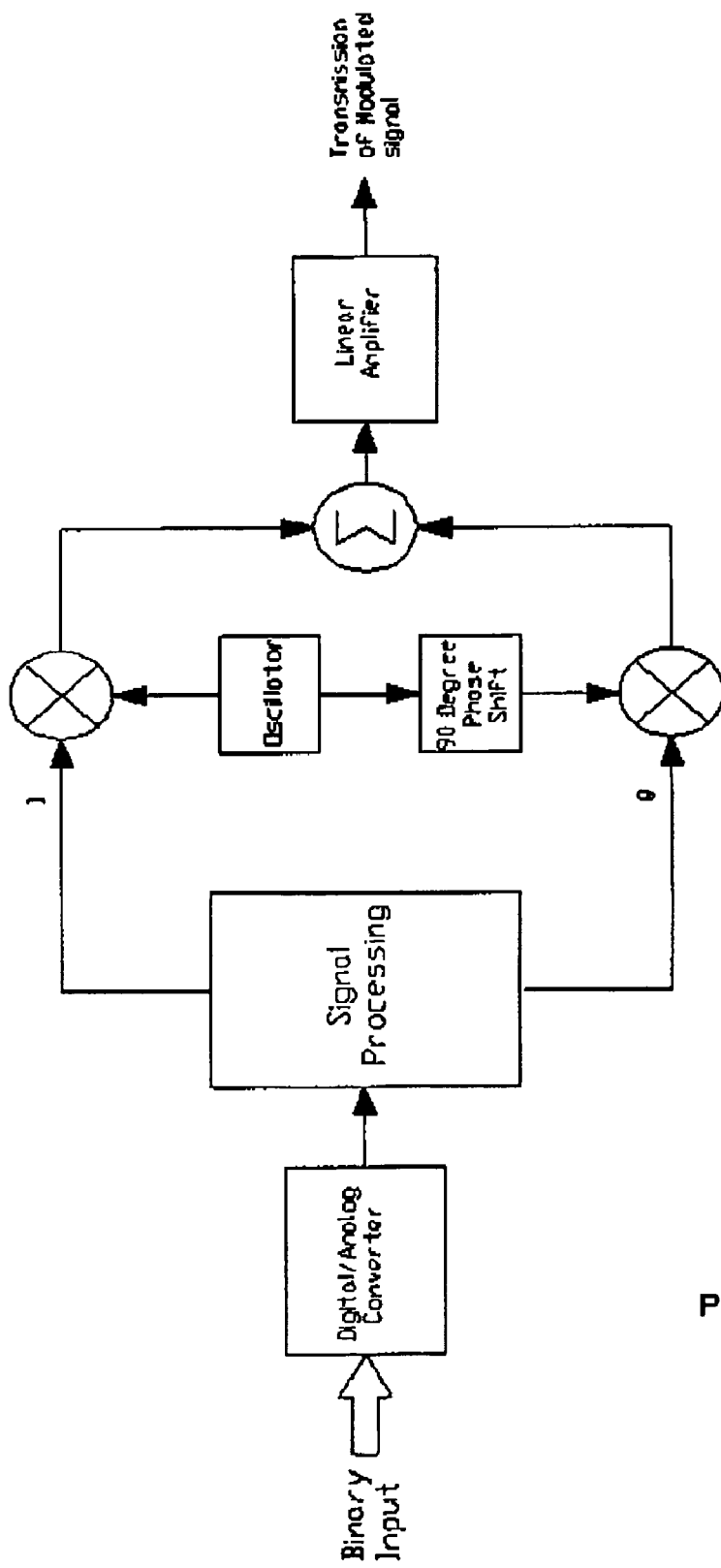
FIG. 1 is a schematic block diagram of a prior art of IQ modulator.
Figure 2:
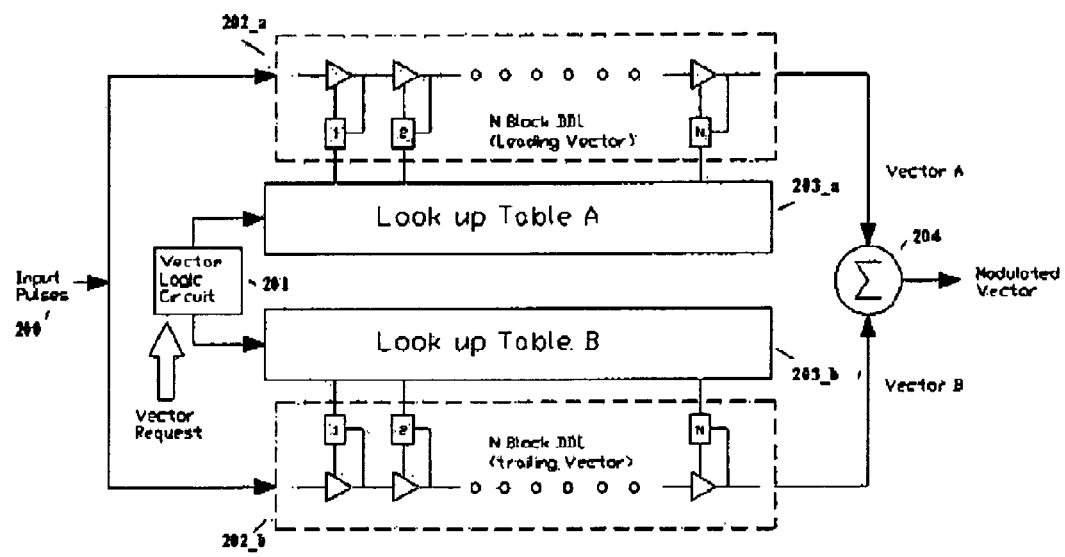
FIG. 2 is a schematic block diagram of one embodiment of an apparatus according to the present invention.

The present invention synthesizes a vector with the desired amplitude and phase using two fixed magnitude vectors that have dynamically controlled phases. FIG. 2 illustrates a block diagram of an embodiment of the invention. The apparatus consists of five major blocks; input pulses 200, a vector logic circuit 201, two digital delay lines 202a and 202b, two lookup tables 203a and 203b, and a signal combiner 204.

The vector logic circuit 201 is supplied with digital data corresponding to the desired magnitude and phase of the output vector. Once the data has been received the logic circuit determines the phase of the two vectors needed to generate the desired output vector. The vector logic circuit 201 determines the phase of each vector by using the following assumptions:

Both vectors will have the same magnitude.

Each vector will be equidistant, radially, from the resultant vector.

Figure 3:
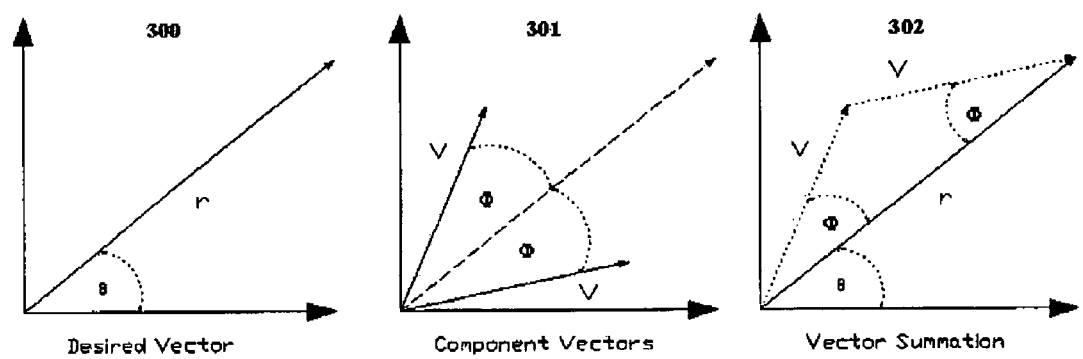
FIG. 3 is a graphical representation of the vector math for the embodiment of FIG. 2.

Having defined the vectors in the above manner the vector logic circuit 201 can determine the phase of each vector. If the desired output vector 300 (FIG. 3) has a magnitude r and phase θ the required angle of rotation away from θ would be equal to $\Phi = \cos^{-1}[r/(2V)]$, where V is the magnitude of the each vector 301. The absolute phase of the leading vector would be θ+Φ, while the absolute phase of the trailing vector would be θ−Φ. Special consideration must be taken when the leading or trailing vector crosses over the $2\pi$ or 360° barrier. In such cases $2\pi$ is either added to, or subtracted from, the absolute phase of the vector depending upon whether it is the leading or trailing vector that has crossed the bound. FIG. 3 shows a graphical example of the vector math.

Figure 4:
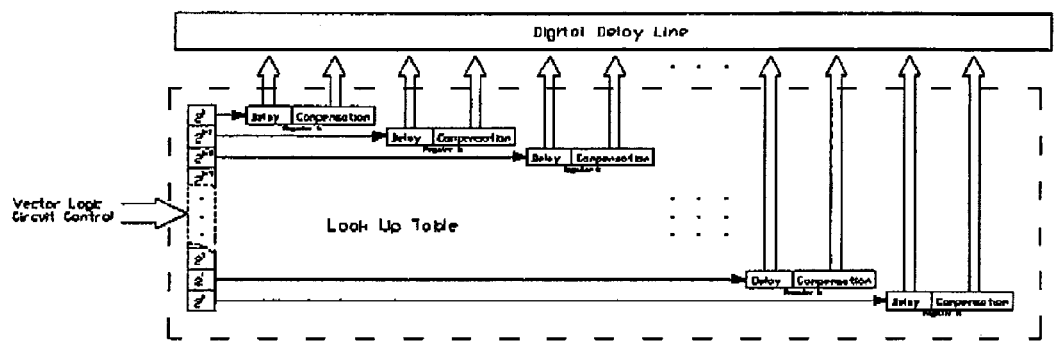
FIG. 4 is a block diagram of the lookup table for the embodiment of FIG. 2.

Once the phase of both vectors required to reproduce the desired output magnitude and phase is determined, the vector logic circuit 201 converts the phase to a required delay time and updates the lookup tables 203a and 203b. Each table is used to select the delay cells required by the delay lines 202 to synthesize the desired phase. The tables must be updated no less than twice the speed of the symbol rate. Lookup table 203a contains the delay information for the vector A, while 203b contains the information for vector B. The preferred implementation of the invention would also include redundant blocks in each table to allow for compensation of the digital delay lines 202. The compensation could take on a form shown in FIG. 4, wherein a N bit binary number controls $2^N$ registers containing both the delay and compensation information. The compensation would ensure that both digital delay lines 202 would have equivalent phase coverage over 360°.

In order to produce the necessary vectors, the digital delay lines 202 require a reference signal. As amplitude compression is not an issue, the reference can be a high power signal. This high power pulse train 200, at the carrier frequency, is supplied to both delay lines. The digital delay lines 202 consist of a finite number (N) of sequential fixed delay cells. The delay of each cell may be equivalent or weighted. Even though the preferred actualization of the invention is to utilize fixed equivalent sequential cells, it could also be implemented using (N) weighted parallel delay cells. The number and weight of the delay cells determine the resolution of the synthesized phase. N should be chosen to realize 360° coverage with the desired resolution. The preferred realization of the invention would also include a finite number of extra delay cells which can be used for compensation for the time resolution steps.

An example of the delay cell implementation is to use an inverter and an edge feedback detector which delays the input pulse by a known amount Delta T. A delayed signal from an output of each delay cell is supplied to the input of the next delay cell. The delay of the digital delay line 202 is set in such a way as to produce the desired phase for the vector. This is accomplished by enabling or disabling specified delay cells in the delay line. The status of each delay cell is set by the lookup table 203. As the delay cell encounters a falling edge it confirms its status with the table and has half a pulse cycle to update its status if required.

The pulses exiting 202a will have the phase that the vector logic circuit 201 deemed necessary for vector A, while the pulses exiting 202b have the phase deemed necessary for vector B. The pulses then enter the summer 204, which combines both vectors 302. The resulting vector has the phase and amplitude corresponding to the desired modulation.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

What is claimed is:

1. An apparatus for amplitude and phase modulation of a signal comprising:

a reference pulse oscillator arranged to provide a signal in the form of a series of input pulses;

an input for input modulating data including desired amplitude and phase modulation;

a vector logic circuit responsive to the input modulating data;

two digital delay lines each coupled to said reference oscillator and each having multiple delay cells for selectively delaying respective pulses of said signal;

two lookup tables each of which contains information for controlling the delay cells of a respective one of the delay lines so that the vector logic circuit controls an overall delay of the respective one of the digital delay lines using the information so as to generate therefrom a component vector which is dependent upon the input modulating data;

and a summer that is coupled to the two digital delay lines and arranged to combine together the component vectors from both of the delay lines to provide an output vector.

2. The apparatus according to claim 1 wherein said vector logic circuit is arranged to utilize the desired amplitude and phase modulation to determine the phase of the two fixed magnitude component vectors.

3. The apparatus according to claim 2 wherein the formula $\pm\cos^{-1}[r/(2V)]$ governs the phase offset of the component vectors from the desired output phase, where, in the governing formula, r represents the desired output magnitude and V is the magnitude of the component vectors.

4. The apparatus according to claim 2 wherein said component vectors are assumed to have the same magnitude and be equidistant, radially, from the resultant vector.

5. The apparatus according to claim 1 wherein said vector logic circuit is arranged to compensate for the special cases where the phase of leading or trailing vectors crosses the 360° barrier, where compensation is accomplished by either adding or subtracting $2\pi$ from the absolute phase of the vector.

6. The apparatus according to claim 1 wherein said vector logic circuit is arranged to convert said phase modulation into an equivalent delay.

7. The apparatus according to claim 6 wherein said vector logic circuit is arranged to update the lookup tables with the information required to reproduce the required delay.

8. The apparatus according to claim 1 wherein said delay lines contain a number of sequential or parallel delay cells capable in combination of covering 360° of phase.

9. The apparatus according to claim 8 wherein said delay cells have equivalent or weighted delay periods.

10. The apparatus according to claim 1 wherein said delay lines contain a finite number of additional delay cells for the purpose of compensation in the range of the finest resolution step.

11. The apparatus according to claim 1 wherein said delay cells contain a feedback edge detector whereupon detection of a falling edge enables the delay cell to confirm its next status from a lookup table.

12. The apparatus according to claim 1 wherein said lookup tables contain the information required to reproduce a specified delay.

13. The apparatus according to claim 1 wherein said lookup tables are directly referenced by the digital delay lines in order to control which delay cells are enabled at a given time.

14. The apparatus according to claim 1 wherein said lookup tables contain redundant registers which contain both delay and compensation information.

15. The apparatus according to claim 1 wherein said digital delay lines generate component vectors of constant amplitude and wherein the summer is coupled to the two digital delay lines for the purpose of combining the two constant amplitude component vectors into a resultant vector containing a desired amplitude and phase.

16. The apparatus according to claim 1 wherein said input pulses form a high power pulse train.

17. The apparatus according to claim 1 in which the input for said input modulating data is digital such that digital data is converted into the output vector which is an analog signal, without the use of digital to analog converters.

18. The apparatus according to claim 1 in which the input for said input modulating data is digital such that digital data is converted into the output vector which is an analog signal, and wherein the output vector is transmitted with minimal amplification.

19. The apparatus according to claim 1 in which the input for said input modulating data is digital such that digital data is converted into the output vector which is an analog signal, and wherein the output vector is amplified utilizing non-linear amplifiers.

* * * * *